United States Patent
Chiu et al.

(10) Patent No.: US 8,498,174 B2
(45) Date of Patent: Jul. 30, 2013

(54) DUAL-PORT SUBTHRESHOLD SRAM CELL

(75) Inventors: Yi-Te Chiu, Hsinchu (TW); Ming-Hung Chang, Hsinchu (TW); Hao-I Yang, Hsinchu (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 132 days.

(21) Appl. No.: 13/243,690

(22) Filed: Sep. 23, 2011

(65) Prior Publication Data

US 2012/0307548 A1 Dec. 6, 2012

(30) Foreign Application Priority Data

Jun. 1, 2011 (TW) .............................. 100119160 A

(51) Int. Cl.
*G11C 8/00* (2006.01)

(52) U.S. Cl.
USPC .................. 365/230.05; 365/189.05; 365/154

(58) Field of Classification Search
USPC .................. 365/230.05, 221, 189.03, 189.05, 365/154, 156
See application file for complete search history.

(56) References Cited

U.S. PATENT DOCUMENTS

| 7,042,792 B2 * | 5/2006 | Lee et al. ................. 365/230.05 |
| 7,489,164 B2 * | 2/2009 | Madurawe ....................... 326/40 |
| 8,331,184 B2 * | 12/2012 | Wang ............................ 365/222 |

* cited by examiner

*Primary Examiner* — Gene Auduong
(74) *Attorney, Agent, or Firm* — Edwards Wildman Palmer LLP; Peter F. Corless; Steven M. Jensen

(57) ABSTRACT

An innovative dual-port subthreshold static random access memory (SRAM) cell for sub-threshold voltage operation is disclosed. During write mode, the dual-port subthreshold SRAM cell would cut off the positive feedback loop of the inverters and utilize the reverse short-channel effect to enhance write capability. The single-ended read/write port structure further reduces power consumption of the lengthy bit line. Therefore, the dual-port subthreshold SRAM cell is a suitable for long operation in a first-in first-out memory system. Although the lower voltage reduces the stability of the memory cell, the dual-port subthreshold SRAM cell of the present invention can still stably operate.

8 Claims, 4 Drawing Sheets

DUAL-PORT SUBTHRESHOLD SRAM CELL

CROSS-REFERENCES TO RELATED APPLICATIONS

This application claims under 35 U.S.C. §119(a) the benefit of Taiwanese Application No. 100119160, filed Jun. 1, 2011, the entire contents of which is incorporated herein by reference.

BACKGROUND OF THE INVENTION

1. Field of the Invention

The present invention relates to dual-port static random access memories (SRAMs), and, more particularly, to a dual-port subthreshold SRAM for operation in a first-in first-out (FIFO) memory system.

2. Description of Related Art

In the semiconductor industry, a single chip system has been developed with a miniaturized size. Particularly, in the biomedical electronic industry, an embedded memory is part of a single chip system, and a static random access memory (SRAM) is widely used for storing and transmitting data.

For an integrated circuit (IC) design in the biomedical electronic industry, fast operation speed is not essential, but long operation without consuming much power is critical. Ultra-low power consumption is achieved by subthreshold operation voltage. However, it needs to consider process variation, voltage variation and temperature variation in a nanometer process. Further, the conventional SRAM has severe diminished the static noise margin (SNM), which adversely affects minor signals.

Therefore, more stable and reliable SRAMs are required for the modern integrated circuits, such that dual-port SRAMs are developed. Referring to FIG. 1, a conventional dual-port SRAM is provided. As shown in FIG. 1, a dual-port SRAM 100 includes cross-coupled inverters 102, 104, a pair of write transistors 108, 112, and a pair of read transistors 106, 110. The cross-coupled inverters 102, 104 are disposed as a memory component at an intermediate region of the dual-port SRAM 100. The write transistor 108 is connected between a write bit line 118 and the memory component via a source/drain of the write transistor 108, and the write transistor 112 is connected between the memory component and a write bit line 120 via a source/drain thereof. The read transistor 106 is connected between the memory component and a read bit line 122 via a source/drain thereof, and the read transistor 110 is connected between the memory component and a read bit line 124 via a source/drain thereof.

However, the SNM becomes smaller due to the diminished signal and the process variation of the dual-port SRAM 100, such that the dual-port SRAM cannot operate at the subthreshold region. In addition, due to the miniaturization of nano-technology and voltage power, the write margin of the dual-port SRAM 100 becomes smaller, and thus additional control circuits are needed for enhancing writing capability. Due to consuming power and increasing the chip area, the additional control circuits are not suitable for FIFO memory systems, which are in long operation.

Accordingly, it is an urgent need to develop SRAMs for long operation at ultra-low voltage, increasing stability, decreasing SNM influence and operation at subthreshold voltage.

SUMMARY OF THE INVENTION

The present invention provides a high stable static random access memory cell for overcoming stability problem due to process variations, various voltages and various temperatures during nano-procedure.

The present invention provides a high stable static random access memory cell for a first-in first-out memory system, such that data access nodes are not disturbed by signals on bit lines during the read mode, and SNM to be read is enhanced.

The present invention provides a dual-port subthreshold static random access memory cell for a first-in first-out memory system and operation under subthreshold voltage. The dual-port subthreshold static random access memory cell includes a write bit line; a write word line; a read bit line; a read word line; a write access module connected to the write bit line and the write word line; a latch connected to the write access module and the write word line; and a read module connected to the latch, the read bit line and the read word line, wherein the latch includes a pass transistor and two cross-coupled inverters, and the pass transistor has a source/drain connected to the two cross-coupled inverters and a gate connected to the write word line.

In one embodiment, the writing capability of the dual-port subthreshold SRAM cell is enhanced by cutting off the positive feedback loop of a memory component of the latch. Certainly, better writing and reading capability may be obtained by reducing threshold voltage ($V_t$) due to the reverse short-channel effect (RSCE).

In comparison with the prior art, the dual-port subthreshold SRAM cell of the present invention can make use of the reverse short-channel effect and stably operate under subthreshold such that stable and reliable read and write capability of the dual-port subthreshold SRAM cell can be enhanced. Further, the dual-port subthreshold SRAM cell of the present invention operates at the subthreshold voltage and has fewer bit lines, so as to reduce leakage current, increase SNM, and decrease disturbance owing to nano-process variations. Hence, the dual-port subthreshold SRAM cell of the present invention is suitable for a FIFO memory system.

DETAILED DESCRIPTION OF THE PREFERRED EMBODIMENTS

The detailed description of the present invention is illustrated by the following specific examples. Persons skilled in the art can conceive the other advantages and effects of the present invention based on the disclosure contained in the specification of the present invention.

Figure 2:
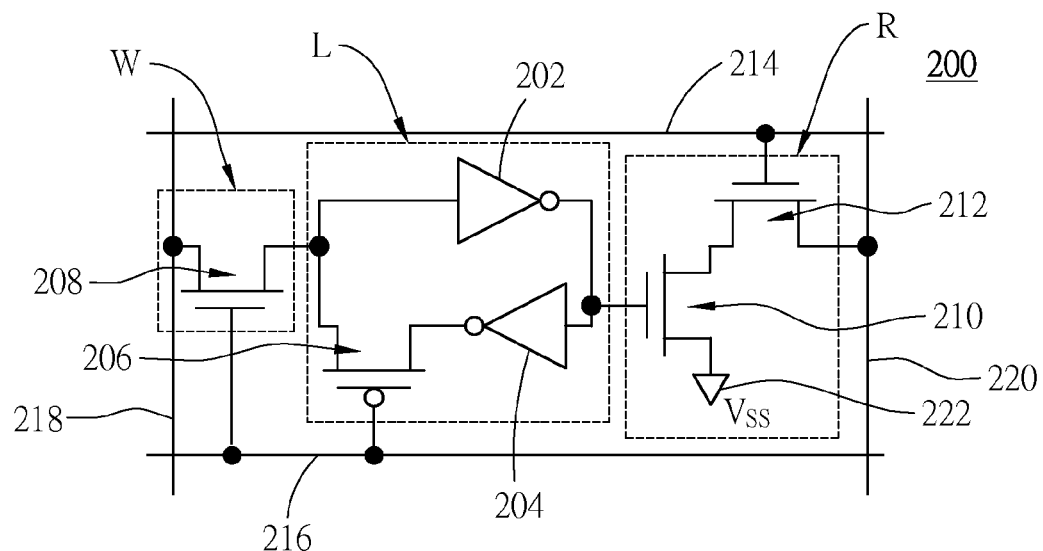
FIG. 2 is a circuit configuration of the dual-port subthreshold SRAM cell according to one embodiment of the present invention.

FIG. 2 shows a circuit configuration of a dual-port subthreshold static random access memory (SRAM) cell 200. As shown in FIG. 2, the dual-port SRAM cell 200 includes latch L having cross-coupled inverters 202, 204 and a pass transistor 206, a write access module W having a write access transistor 208, and a read word line 214, a write word line 216, a write bit line 218 and a read bit line 220 arranged at periphery.

The read word line 214 and the word bit line 220 are connected to the read module R, the write word line 216 is connected to the write access module W and the latch L, and the write bit line 218 is connected to the write access module W.

The cross-coupled inverters 202, 204 are disposed at an intermediate region of the dual-port subthreshold SRAM cell 200 so as to be memory components of the dual-port subthreshold SRAM cell 200, and are formed from two complementary transistors. The source/drain of the pass transistor 206 is connected to an input end of the inverter 202 and an output end of the inverter 204 to form the latch L. In one embodiment, a source and a drain of the pass transistor 206 are respectively connected to an input end of the inverter 202 and an output end of the inverter 204. In another embodiment, a source and a drain of the pass transistor 206 are respectively connected to an output end of the inverter 204 and an input end of the inverter 202.

The write access transistor 208 is connected between the write bit line 218 and the latch L via the source/drain of the write access transistor 208. In one embodiment, a source and a drain of the write access transistor 208 are respectively connected to the write bit line 218 and the latch L. In another embodiment, a drain and a source of the write access transistor 208 are respectively connected to the write bit line 218 and the latch L. The write access transistor 208 has enhanced writing capability by using reverse short-channel effect (RSCE).

A gate of the read transistor 210 is connected to the latch L, the source/drain of the read transistor 210 is respectively connected to ground (VSS) and the source/drain at one end of the read transistor 212, and the source/drain at another end of the read transistor 212 is connected to the read bit line 220. The gate of the read transistor 212 is connected to the read word line 214.

Since decoupling may be performed on the read transistors 210, 212 and the read bit line 220, data access nodes are not affected by noise disturbance on the bit lines during the read mode, such that the SNM to be read is enhanced. Further, the read transistors 210, 212 can enhance read capability and read margin of the read bit line 220 by using the reverse short-channel effect (RSCE).

In addition, the variation of the threshold voltage ($V_t$) is proportional to the square root of the length of the transistor multiplied by the width of the transistor. Therefore, longer channels may decrease the impact and influence resulting from $V_t$. In the subthreshold region, the RSCE causes $V_t$ to be smaller, such that the length of the transistor is increased for increasing the average reading current and decreasing the reading delay.

While the dual-port subthreshold SRAM cell 200 operates at a subthreshold region, the writing capability is significantly enhanced. Moreover, the write margin is increased by cutting off the positive feedback loop of the memory component formed from the cross-coupled inverters 202, 204, such that the write margin is increased without additional circuits.

During the write mode, the write word line 216 would switch on the write access transistor 208 and switch off the pass transistor 206. Data would be transmitted to the inverters 202, 204 via the pass transistor 206, and the pass transistor 206 would decrease threshold voltage by using RSCE, so as to obtain more write margin.

Figure 3A:
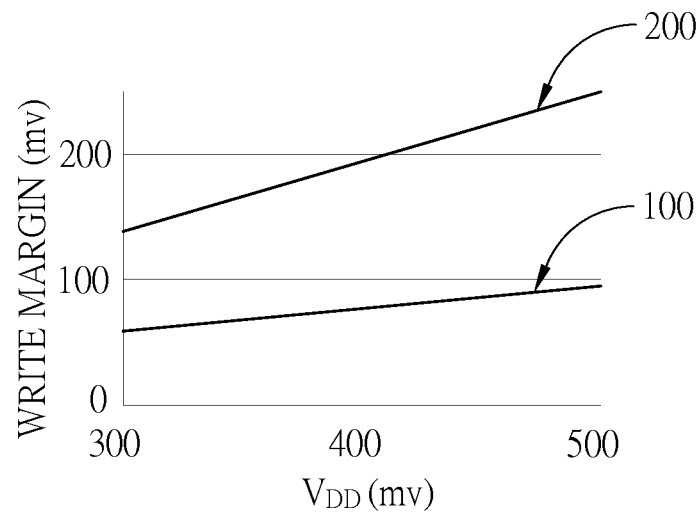
FIG. 3A and FIG. 3B are diagrams showing the comparison of static noise margin (SNM) between the dual-port subthreshold SRAM cell of the present invention and the conventional dual-port SRAM cell.
Figure 3B:
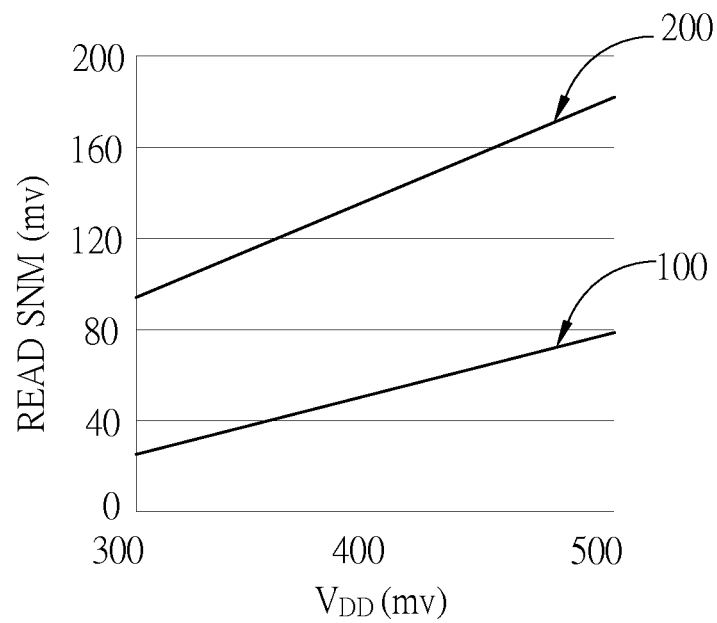

FIG. 3A and FIG. 3B show the comparison of SNM between the dual-port subthreshold SRAM cell 200 of the present invention and the conventional dual-port SRAM cell 100.

As shown in FIG. 3A, the dual-port subthreshold SRAM cell 200 of the present invention operates at the subthreshold region to enhance writing capability, and increases write margin by cutting off the positive feedback loop of the cross-coupled inverters 202, 204 rather than adding additional circuits. In addition, the pass transistor 206 decreases $V_t$ by using RSCE so as to obtain more write margin. Hence, the dual-port subthreshold SRAM cell 200 of the present invention has higher write SNM value than the conventional SRAM 100.

As shown in FIG. 3B, in the subthreshold region, the longer channel would decrease the impact and influence resulting from $V_t$. In the subthreshold region, the RSCE causes $V_t$ to be smaller, such that the length of the transistor is increased for increasing the average reading current and decreasing the reading delay. Further, since decoupling is performed on the read transistors 210, 212 and the read bit line 220, data access nodes are not affected by noise disturbance on the bit lines during the read mode, such that the SNM to be read is enhanced. The read transistors 210, 212 enhances read capability and read margin of the read bit line 220 by using the reverse short-channel effect (RSCE). Hence, the dual-port subthreshold SRAM cell 200 of the present invention has higher read SNM value than the conventional SRAM 100, and thus overcomes the SNM value getting smaller in the prior art.

Figure 4A:
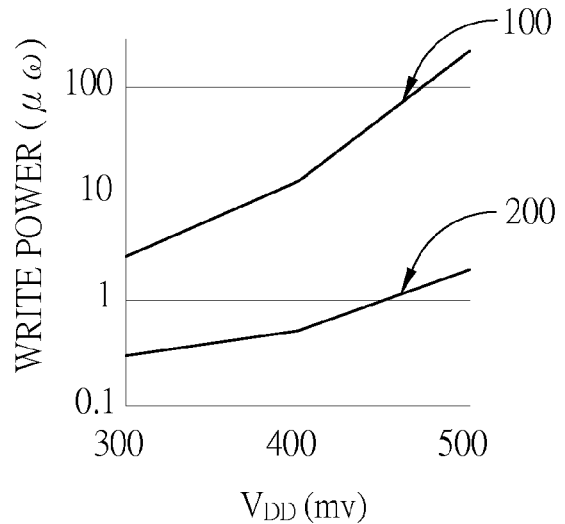
FIG. 4A to FIG. 4C are diagrams showing the comparison of power consumption between the dual-port subthreshold SRAM cell of the present invention and the conventional dual-port SRAM cell.
Figure 4B:
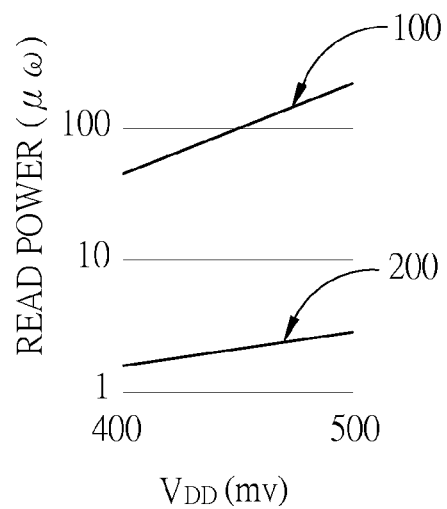
Figure 4C:
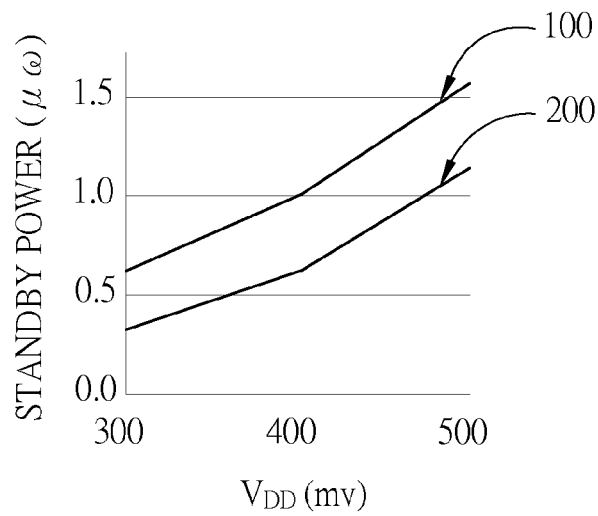

FIG. 4A to FIG. 4C show the comparison of power consumption between the dual-port subthreshold SRAM cell 200 of the present invention and the conventional dual-port SRAM cell 100. FIG. 4A shows the comparison of the write power consumption between the dual-port subthreshold SRAM cell 200 of the present invention and the conventional dual-port SRAM cell 100. FIG. 4B shows the comparison of the read power consumption between the dual-port subthreshold SRAM cell 200 of the present invention and the conventional dual-port SRAM cell 100. FIG. 4C shows the comparison of power consumption at standby status between the dual-port subthreshold SRAM cell 200 of the present invention and the conventional dual-port SRAM cell 100.

Figure 1:
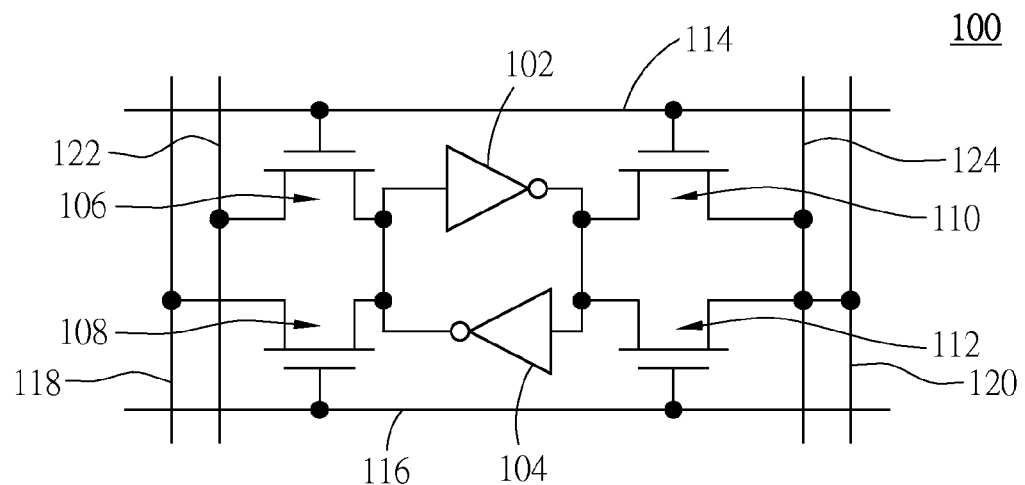
FIG. 1 is a circuit configuration of the conventional static random access memory (SRAM)

In the present invention, the single-ended read/write port structure can effectively reduce the number of bit lines, so as to reduce power consumption. Therefore, the dual-port subthreshold SRAM cell of the present invention is suitable for being used in biomedical industry or FIFO memory systems. In comparison with the prior art shown in FIG. 1, the present invention at least reduces one read bit line and one write bit line in the dual-port subthreshold SRAM cell.

Figure 5:
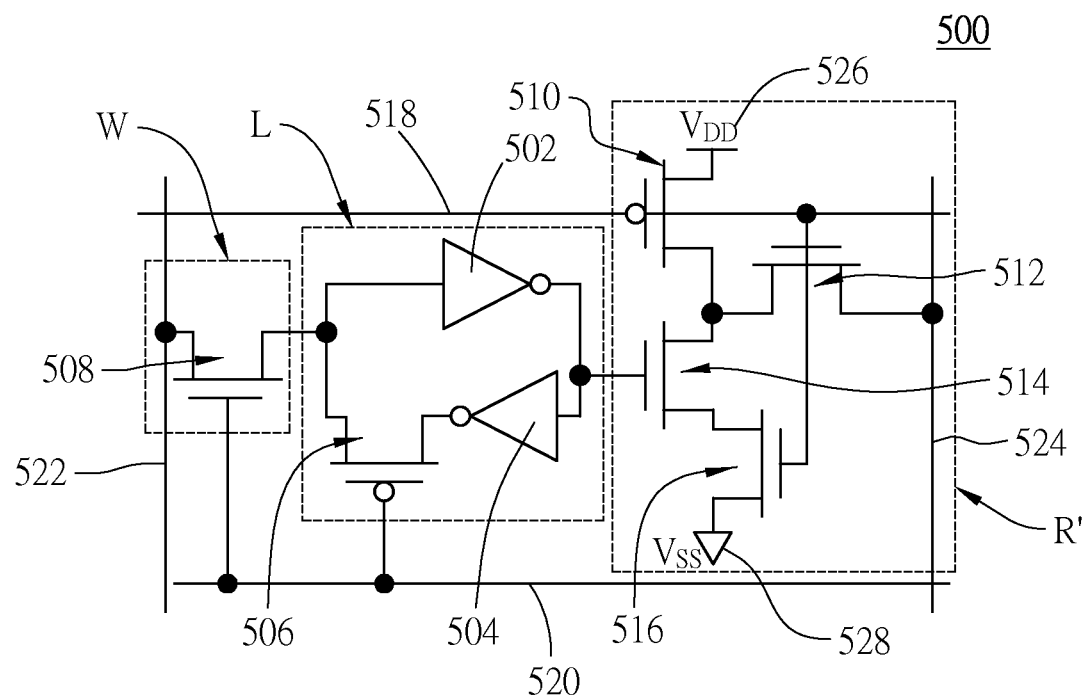
FIG. 5 is a circuit configuration of the dual-port subthreshold SRAM cell according to another embodiment of the present invention.

FIG. 5 shows another circuit configuration of the dual-port subthreshold SRAM cell 500 of the present invention. The dual-port subthreshold SRAM cell 500 differs from the dual-port subthreshold SRAM cell 200 shown in FIG. 2 in that the read module R is replaced with the read module R'.

As shown in FIG. 5, the dual-port subthreshold SRAM cell 500 includes a latch L having cross-coupled inverters 502, 504 and a pass transistor 506, a write module W having a write access transistor 508, and a read module R' having read transistors 510, 512, 51, 516.

The cross-coupled inverters 502, 504 are disposed at an intermediate region of the dual-port subthreshold SRAM cell 500 to be memory components of the dual-port subthreshold SRAM cell 500, and are formed from two complementary transistors. The source/drain of the pass transistor 506 is connected to an input end of the inverter 502 and an output end of the inverter 504 to form the latch L.

The source/drain at one end of the write access transistor 508 is connected to the latch L, and the source/drain at another end of the write access transistor 508 is connected to the write bit line 522.

The source/drain at one end of the read transistor 510 is connected to the power end (VDD) 528, and the gate of the read transistor 510 is connected to the read word line 518. The source/drain at one end of the read transistor 516 is connected to ground (VSS) 528, and the gate of the read transistor 516 is connected to the read word line 518. The source/drain of the read transistor 512 is connected to the read bit line 524, the read transistor 510 and the source/drain of the read transistor 514. The gate of the read transistor 514 is connected to the latch L, and the source/drain of the read transistor 514 is connected to the source/drain of the read transistors 510, 512, 516.

Since decoupling is performed on the read transistors 510, 512, 514, 516 and the read bit line 524, data access nodes are not affected by noise disturbance on the bit lines during the read mode, such that the SNM to be read is enhanced. Further, the read transistors 510, 512, 514, 516 can enhance read capability and read margin of the read bit line 524 by using the reverse short-channel effect (RSCE).

The dual-port subthreshold SRAM cell 2500 operates at a subthreshold region, such that the writing capability is significantly enhanced. Moreover, the write margin may be increased by cutting off the positive feedback loop of the cross-coupled inverters 502, 504, such that the write margin is increased without additional circuits. In addition, during the write mode, the write word line 520 would switch on the write access transistor 508 and switch off the pass transistor 506. Data would be transmitted to the inverters 502, 504 via the pass transistor 506, and the pass transistor 506 would decrease $V_t$ by using RSCE, so as to obtain more write margin.

The present invention provides a dual-port threshold SRAM cell for long operation in FIFO memory systems. The dual-port threshold SRAM cell of the present invention has anti-noise capability by using RSCE during the read mode, and has increased stability during the write mode. Certainly, the dual-port threshold SRAM cell of the present invention can not only be used in FIFO memory systems, but also in mobile communication systems, biomedical electronic systems, computer systems and other associated systems.

The present invention provides a dual-port SRAM cell design for subthreshold voltage operation. Although voltage decrease usually reduces stability, the dual-port SRAM cell can still stably operate at subthreshold voltage. Further, during the write mode, the dual-port SRAM cell of the present invention can enhance writing capability by cutting off the position feedback loop of the memory component. Moreover, the single-ended read/write port structure decreases power consumption. Accordingly, the present invention provides memory cell for long operation in FIFO memory systems.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

The invention claimed is:

1. A dual-port subthreshold static random access memory cell for sub-threshold voltage operation, comprising:
   a write bit line;
   a write word line;
   a read bit line;
   a read word line;
   a write access module connected to the write bit line and the write word line;
   a latch connected to the write access module and the write word line, wherein the latch comprises a pass transistor and two cross-coupled inverters, the pass transistor has a source/drain connected to the two cross-coupled inverters and a gate connected to the write word line; and
   a read module connected to the latch, the read bit line and the read word line.

2. The dual-port subthreshold static random access memory cell of claim 1, wherein the write access module has a write access transistor having a drain/source connected to the write bit line and the latch and a gate connected to the write word line.

3. The dual-port subthreshold static random access memory cell of claim 1, wherein the read module has a first and a second read transistors.

4. The dual-port subthreshold static random access memory cell of claim 3, wherein the first read transistor has a gate connected to the latch, an end with a drain/source connected to a drain/source of an end of the second read transistor, and another end with a drain/source connected to a ground; and the second read transistor has a gate connected to the read word line, and an end with a drain/source connected to the read bit line.

5. The dual-port subthreshold static random access memory cell of claim 1, wherein the read module has a first, a second, a third and a fourth read transistors.

6. The dual-port subthreshold static random access memory cell of claim 5, wherein the first, the second, the third and the fourth read transistors respectively have a gate connected to the read word line; the first read transistor has an end with a drain/source connected to a power end and another end with a drain/source connected to a drain/source at an end of the second read transistor and connected to a drain/source at an end of the third read transistor; the second read transistor has another end with a drain/source connected to the read bit line; the third read transistor has another end with a drain/source connected to a drain/source at an end of the fourth read transistor; and the fourth read transistor has another end with a drain/source connected to a ground.

7. The dual-port subthreshold static random access memory cell of claim 1, being used in a first-in first-out memory system.

8. The dual-port subthreshold static random access memory cell of claim 1, wherein the read module, the latch or the write access module is operated by using a reverse short channel effect.

* * * * *